United States Patent [19]

Langberg

[11] Patent Number: 4,879,698
[45] Date of Patent: Nov. 7, 1989

[54] PIEZOPOLYMER ACTUATORS

[75] Inventor: Edwin Langberg, Medford, N.J.

[73] Assignee: Sensor Electronics, Inc., Mount Laurel, N.J.

[21] Appl. No.: 266,864

[22] Filed: Nov. 3, 1988

[51] Int. Cl.⁴ .......................................... H04R 23/00
[52] U.S. Cl. .................................. 367/140; 310/800; 310/348; 340/407; 901/46
[58] Field of Search ................. 367/140, 191; 340/407; 73/862.04; 901/33, 46; 414/5; 310/800, 348

[56] References Cited

FOREIGN PATENT DOCUMENTS 0042474 3/1980 Japan ................................... 310/800
0222977 12/1984 Japan ................................... 310/800

OTHER PUBLICATIONS

"Cylindrical PVF$_2$ Electromechanical Transducers" by D. H. Dameron and J. G. Linvill, *Sensors and Actuators* (1981/82), pp. 73–84.
"Piezoelectric Polymer Transducer Arrays" by Linvill, Proceedings of the Sixth IEEE International Symposium on Applications of Ferroelectrics, pp. 506–510.

*Primary Examiner*—Charles T. Jordan
*Assistant Examiner*—J. Woodrow Eldred

[57] ABSTRACT

Piezopolymer actuator, wound in a bifilar fashion on two pins, is operated in a compressive mode without buckling. In addition to constraining motion of the winding along the surface of the pins, the pins also provide wide area electrical contacts with conductive electrodes on the surfaces of the piezopolymer strip. The electrodes consist of a thin film of metallization coated with graphite. Graphite coating heals microcracks in metallization, adds body to the piezopolymer strip, and lubricates winding-pin interfaces. Modular linear arrays of actuators are readily built from a single strip of piezopolymer. Linear array modules are in turn clamped together to form a two-dimensional array. Typical application is a tactile array for the blind.

13 Claims, 4 Drawing Sheets

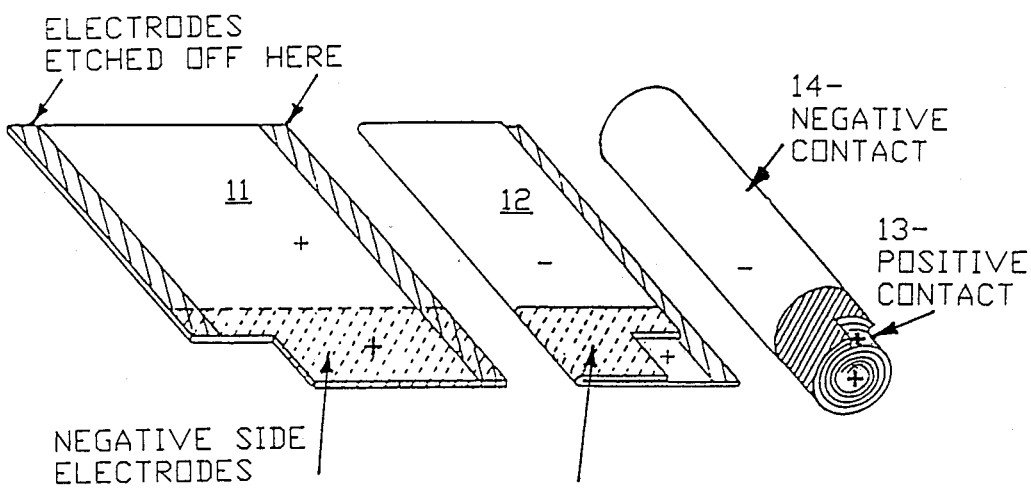
FIG. 1A (PRIOR ART)
FIG. 1B (PRIOR ART)
FIG. 1C (PRIOR ART)
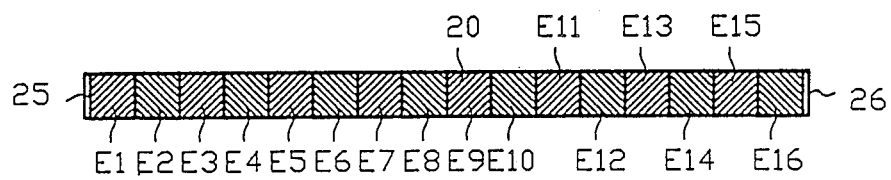
FIG. 2
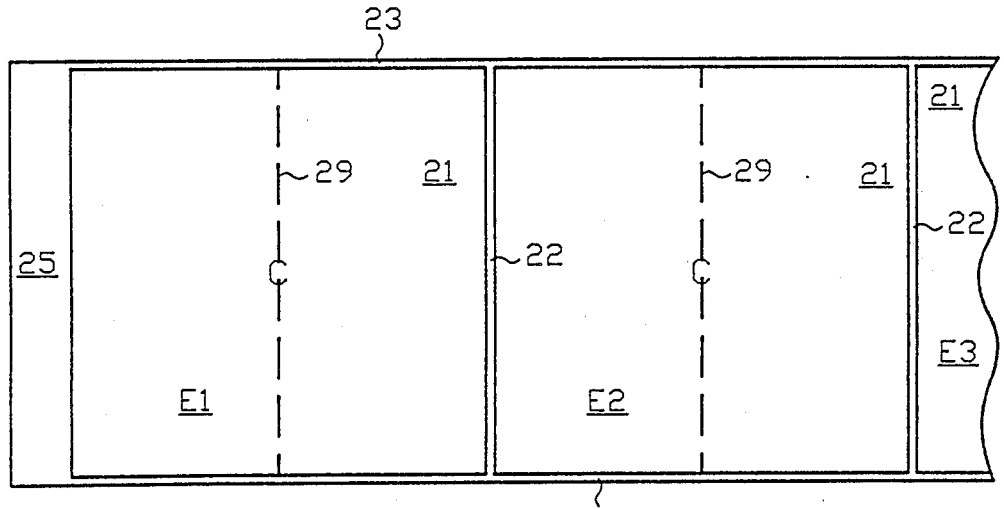
FIG. 3

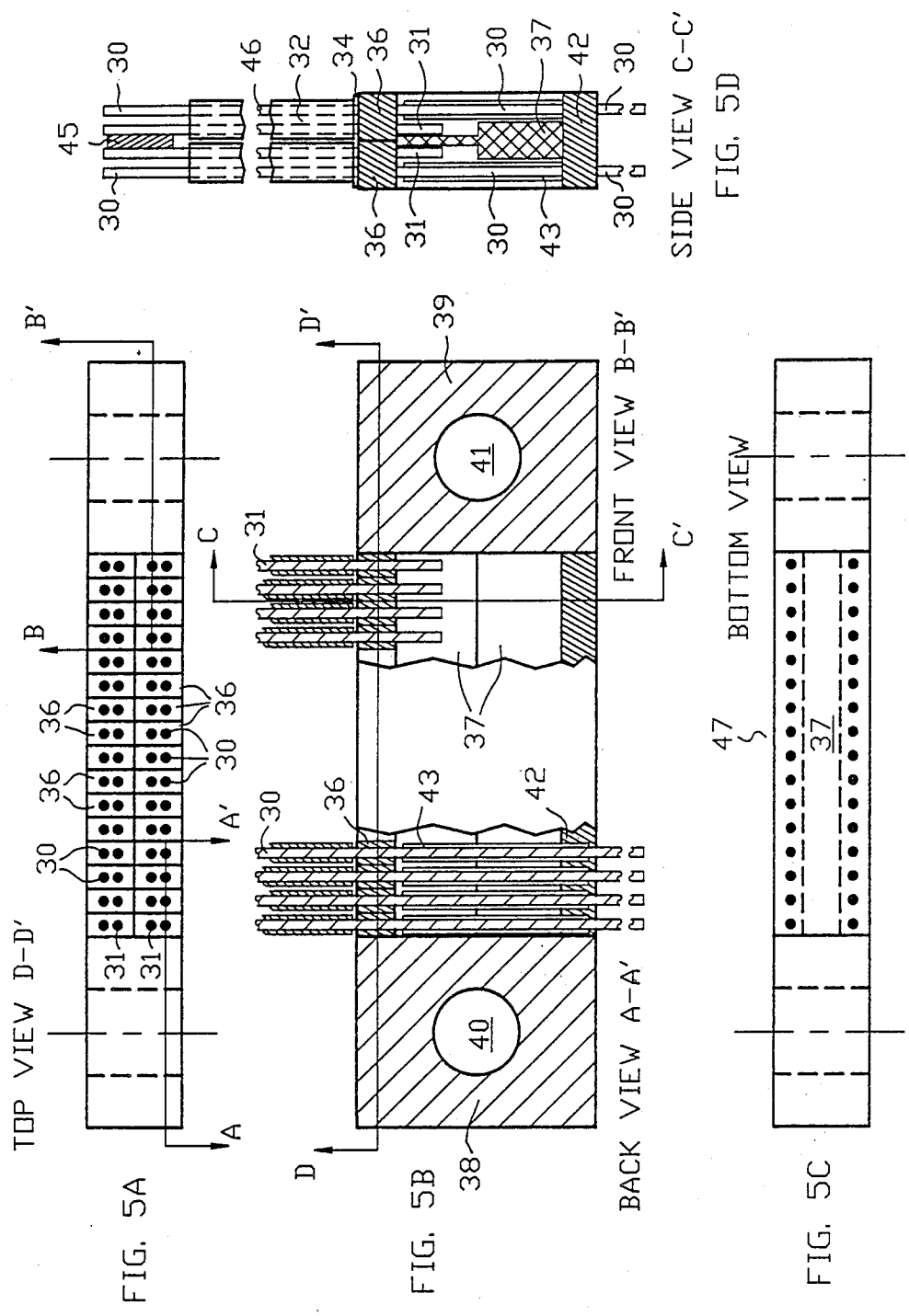

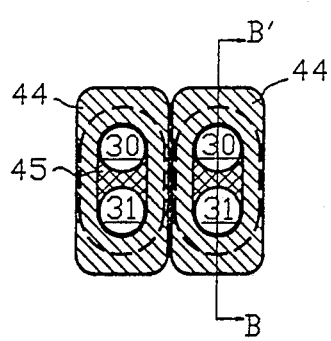
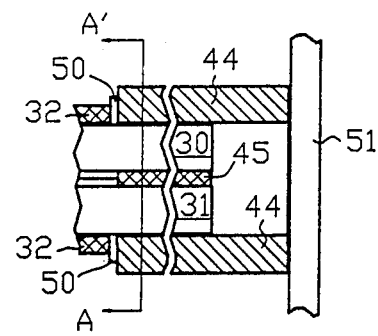
FIG. 6A          FIG. 6B
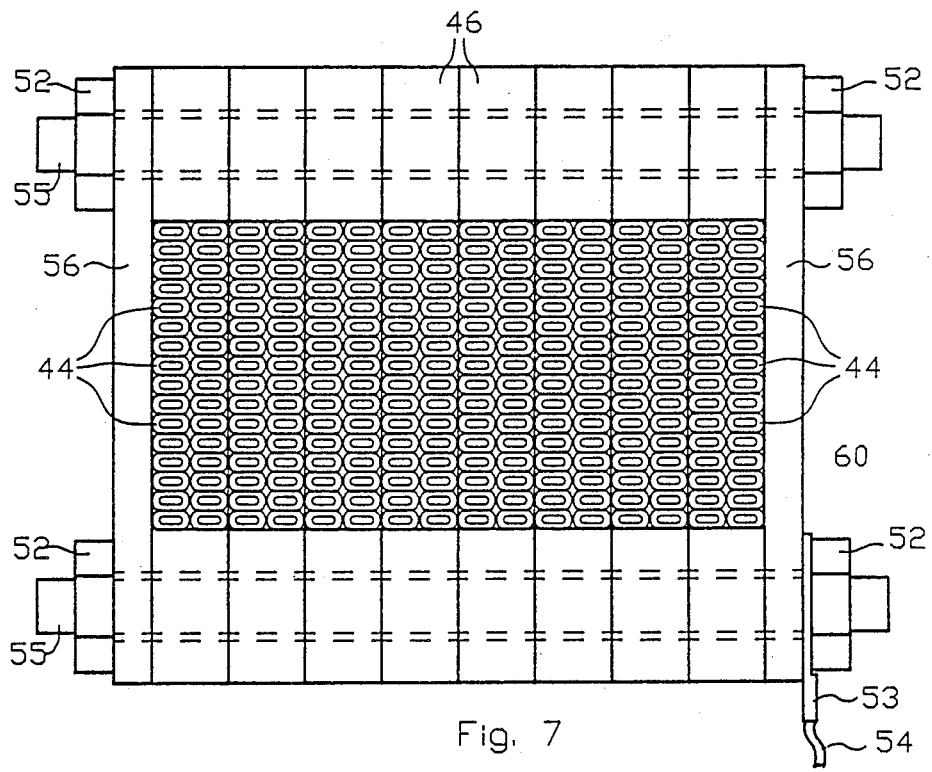
Fig. 7

PIEZOPOLYMER ACTUATORS

This invention made with Government support under Contract N44-NS-8-2394 awarded by the National Institute of Neurological and Communicative Disorders and Stroke, National Institute of Health. The Government has certain rights in this invention.

BACKGROUND OF THE INVENTION

This invention relates to piezopolymer actuators and specifically to application of such actuators in tactile arrays.

In the frequency region between 250 and 300 Hz, the fingertips are very sensitive to vibratory motion. It is sufficient to have an amplitude of vibration in the order of 10 microns to recognize patterns. Tactile arrays composed of closely packed columnar actuators with center-to-center spacing of 1–2 mm are very desirable for the design of a Braille-type reader or, in fact, for a general computer display device for the blind. Dense arrays can also be used to convert sound patterns to tactile patterns and thus substitute for hearing for the deaf.

Commercially available OPTACON tactile stimulator for the blind, manufactured by Telesensory Systems, Inc., in Mountain View, Calif., uses a 144 actuator array. Individual actuators are made from a piezoelectric ceramic, lead zirconite titanate (PZT). While PZT is an effective material for the transformation of electrical energy to mechanical energy, PZT is nonetheless heavy and fragile and therefore not well suited for a portable instrument in a rough environment. Furthermore, ceramic actuators, because of their size, cannot easily be formed into large, dense arrays.

Each piezoelectric actuator is assembled by hand with epoxy, and separate contact wires are required for each element. The cost of assembling the tactile array is therefore high since the manufacture does not lend itself well to mass production. Significant increase of the density and the number of elements, beyond the recently available one hundred and forty-four, is not practical due to limitations of the above state-of-the-art.

Piezoelectric polymers, such as polyvinylidene difluoride (PVdF) film, are attractive alternatives to ceramic piezoelectrics for an actuator design. Pennwalt Corp., among others, manufactures PVdF as a metallized pliable film, available in 9–52 microns thickness, under the trade name of Kynar. The properties of the PVdF piezoelectric polymer are very different from ceramic piezoelectrics. PVdF is less dense and much more pliable than ceramic piezoelectric materials. Its piezoelectric charge coefficient is about one tenth of that for lead zirconate titanate (PZT). However, the alternating field strength which can be applied to PVdF without depolarization is one hundred times greater than that which can be applied to PZT, resulting in ten times greater maximum linear strain. (Maximum linear strain is the ratio of elongation to the length of the piezoelectric element corresponding to the maximum operating electric field.)

The actuators discussed here use PVdF in the transverse mode: The application of a voltage across two metallized electrodes deposited on the faces of the film causes the material to expand or contract along the axis corresponding to the direction of stretch during film fabrication.

The theoretical potential of PVdF as a tactile array element has been recognized by Prof. J. G. Linvill of Stanford University, whose earlier research led to the development of the OPTACON. Because of its pliability, PVdF is ordinarily used as a tension member rather than as a compression member. Linvill initially hoped that PVdF wound into a free-standing cylindrical tube could be used in a transverse mode as a compressive strut. Such tubes can be closely packed into a dense multi-element two-dimensional array.

The results of the investigation of freestanding cylindrical struts has been reported in an article by D. H. Dameron and J. G. Linvill entitled "Cylindrical PVF$_2$ Electromechanical Transducers" in *Sensors and Actuators*, Vol. 2 (1981/82) pp. 73–84. Construction of such a tubular strut is shown in FIG. 1, which is substantially a replica of FIG. 3 in the above article.

Dameron and Linvill discuss a number of serious problems which they encountered which eventually resulted in abandoning any attempt to manufacture the device in FIG. 1. The metallized electrodes deposited on the film of PVdF consist of a layer of nickel-chromium approximately 0.06 microns thick. Winding the flat-stock PVdF film into a small radius cylindrical strut produces creases in the film which cause small cracks in the electrodes. These cracks electrically isolate islands of metallization on the film, preventing some portions of the electrode surface from being energized. The damaged electrode regions quickly fail due to the higher non-uniform current densities and weakened bonding caused by the cracks. This problem is particularly severe with 8–9 micron PVdF film. It caused Dameron and Linvill to abandon this thin material even for laboratory devices, in favor of 30 micron PVdF film.

The maximum electrical field which can be repeatedly applied to PVdF film is 30 volts per micron. For maximum linear strain, an actuator wound from 8 micron material requires a peak voltage of ±240 volts. The thicker film of 30 microns which Dameron and Linvill used requires a peak voltage of ±900 volts. In anything but a laboratory demonstration, it is very difficult and expensive to design hundreds of drivers for a tactile array with the capability of a 1800 volt swing. On the other hand, a 480 volt swing can be handled with presently available solid-state power drivers.

A general problem in high linear strain mode of operation, regardless of PVdF film thickness, is that the metallized electrodes clearly do not stretch as the underlying PVdF substrate shrinks and elongates. Consequently, the electrodes are likely to break up into islands, and electrical conductivity between these islands becomes haphazard and unreliable.

The actuator in FIG. 1 requires two connections per actuator. These connections are accomplished by bonding pads provided on the actuator to printed circuit board traces, using conductive epoxy. A major problem is loss of electrical connection due to high current density at the bond points. This problem is further aggravated by the difference in thermal expansion between the PVdF, the electrode material, and the conductive epoxy causing microcracks to form in the electrode metallization and leading to contact failure. Electrical connection to an actuator in FIG. 1 is a difficult manual operation largely negating any assembly advantage over PZT actuators.

Linvill summarized the state of the art of piezopolymer cylindrical struts (J. G. Linvill "Piezoelectric Polymer Transducer Arrays", *Proceedings of the Sixth*

*IEEE International Symposium on Applications of Ferroelectrics.* (1986) pp. 506–510) by saying:

"The obvious limitation of the cylindrical strut as an element in a piezoelectric array is the complication in its construction. These elements made in conjunction with the work reported in Reference 4 (Dameron & Linvill) were constructed singly and by hand. Arrays of larger numbers of elements using these methods never appeared feasible."

Thus, there is a need for a reliable and durable actuator of a long cylindrical form which can be densely packed into an array and which can be mass produced.

SUMMARY OF THE INVENTION

Accordingly, a main object of the invention is the design of a piezopolymer actuator which is reliable, easy to manufacture and mass produce and which is well suited for application in dense tactile arrays.

A further object of the invention is to provide a supporting structure for piezopolymer winding which constricts its motions to a single, axial degree of freedom and so prevents buckling on compression.

A further object of the invention is to provide electrical contacts to electrodes via the supporting structure.

A still further object of the invention is to provide a conductive and stretchable coating on the electrodes to provide electrical continuity, to strengthen the electrodes, and to aid the motion of the winding with respect to stationary supports.

Further advantages of the invention will become apparent from the consideration of the drawings and the ensuing description thereof.

BRIEF DESCRIPTION OF THE DRAWINGS

FIG. 1 illustrates prior art of cylindrical PVdF actuators.

FIG. 2 shows PVdF film strip used for construction of a linear array.

FIG. 3 illustrates details of electrode metallization pattern on the PVdF film strip.

FIGS. 5A, 5B, 5C, and 5D show four views of the bottom assembly of a 2×16 array module.

FIGS. 6A and 6B show two views of top assembly of typical actuator pair.

FIG. 7 is the top view of a two hundred and fifty-six pin tactile array composed of eight 2×16 array modules.

DETAILED DESCRIPTION OF THE PREFERRED EMBODIMENT

Figure 4:
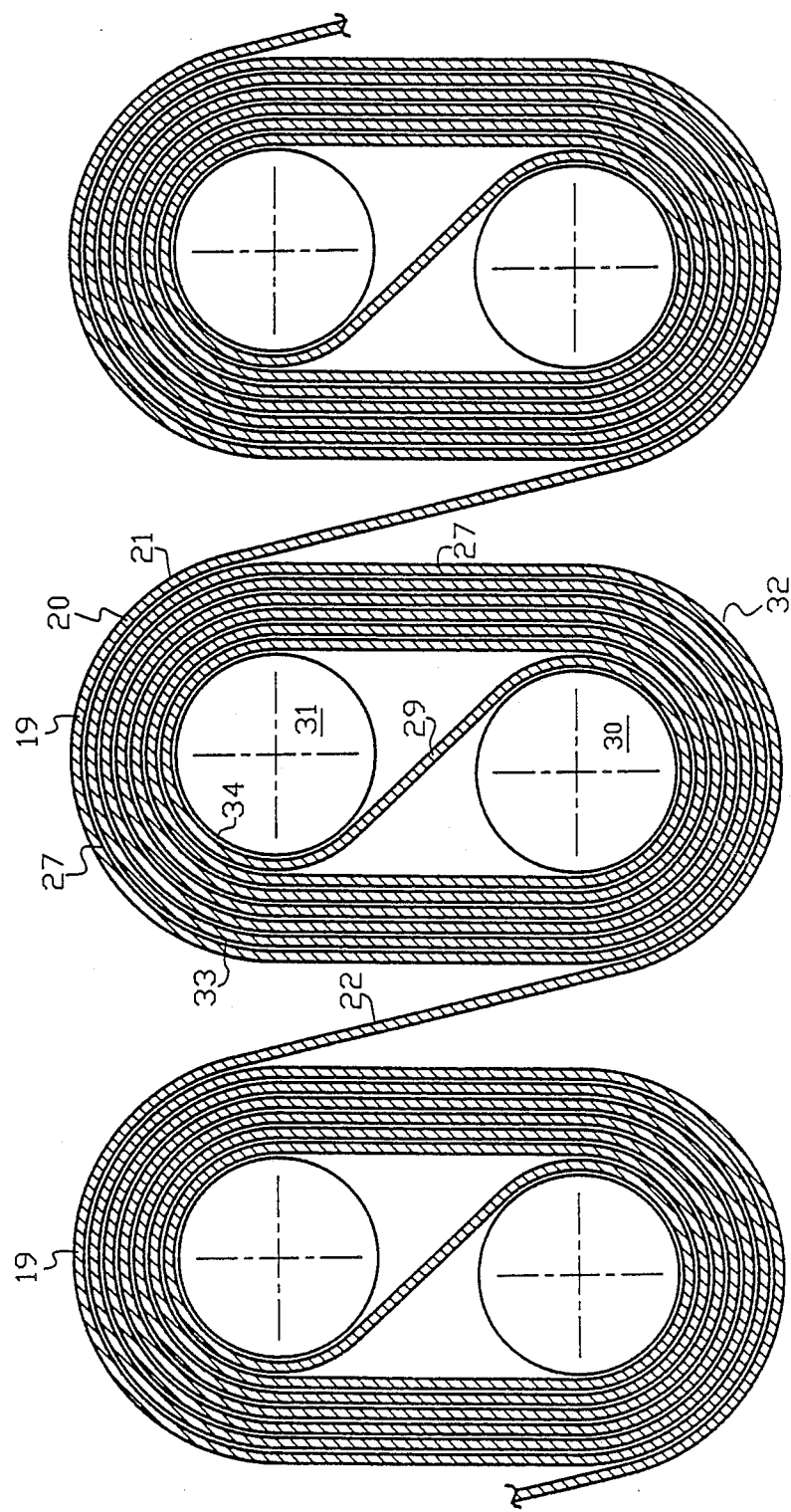
FIG. 4 shows a winding of piezopolymer strip on guiding pins.

FIGS. 1A, 1B, and 1C are based on the article by Dameron and Linvill referred to earlier. It represents the prior art of the design and fabrication of cylindrical piezopolymer actuators. Three stages of fabrication are shown from left to right. FIG. 1A shows a PVdF film strip, cut from a 30 micron thick PVdF sheet, with positive electrode 11 on top side, and negative electrode 12 (shown later in FIG. 1B) on bottom side of the PVdF film. Part of the metallization has been taken off by etching.

FIG. 1B shows the metallized PVdF film strip after it is folded. In FIG. 1C, the folded strip is rolled into a cylindrical actuator. The location of the contact 13 for positive electrode and contact 14 for negative electrode is shown where bonding to circuit traces on the printed circuit board is subsequently accomplished with conductive epoxy.

In the preferred embodiment of the invention, one PVdF film strip serves many actuators. FIG. 2 shows a metallized PVdF strip 20, which is 26 millimeters (mm) wide and 431 mm long. Location of sixteen metallized electrode patterns E1 . . . E16 on a single strip of PVdF is shown. Metallized neutral electrode 27 (not shown) covers the bottom side of strip 20. Two unmetallized 1.5 mm margins are provided: left margin 25 at beginning of metallized PVdF strip 20 and right margin 26 at end.

FIG. 3, corresponding to the beginning of the metallized PVdF strip 20 on the left of FIG. 2, illustrates details of the repetitive pattern of metallization which is obtained by depositing gold through a mask. "Hot" electrode 21 of each actuator consists of a metallized rectangle 25 mm wide and 25 mm high. The "hot" electrodes 21 are separated from each other by a 1.5 mm gap 22 devoid of metallization. An unmetallized top margin 23 and bottom margin 24, each 0.5 mm wide are provided. Margins 23, 24, 25 and 26 guard against an electrical short along the edges. A center line 29 is silk screened in the center of the electrode. This line is used in assembly of the actuator discussed in conjunction with FIG. 4.

Prior to assembly, metallized electrodes 21 and 27 are covered with a coating of stretchable and electrically conductive material.

One such coating material is graphite. Graphite is electrically conductive. The structure of graphite is such that the carbon atoms are arranged in a layered form of parallel planes. Atoms in the plane of a layer are bonded with energy of about 100 kilocalories per gram-atom (kcal/g-atom). In contrast, an energy of only a few kcal/g-atom bond atoms along the axis at a right angle to the layer. Due to this large difference in bonding energy, even small shear forces cause slippage of the graphite layers. This atomic structure is responsible for stretchable and lubricating properties of graphite.

A coating of graphite deposited on the metallized electrodes 21 and 27 consists of graphite platelets of about 40 microns in diameter with their shear planes parallel to the plane of the metallized electrodes.

An alternative stretchable and electrically conductive coating on metallized electrodes 21 and 27 is mercury. The propensity for mercury to form amalgams with a majority of the elements restricts the number of metals which can be used for electrode metallization. Specifically suited are transition metals nickel (Ni), titanium (Ti), cobalt (Co), vanadium (V), chromium (Cr), iron (Fe), niobium (Nb), molybdenum (Mo), tantalum (Ta) and tungsten (W). The above metals have low solubility in mercury (less than 10 parts per million at room temperature). Chromium is particularly attractive since it forms a strong corrosion and wear resistant film on PVdF.

Chemical or plasma surface etching is used to remove surface impurities from electrodes. Subsequent contact of mercury with a clean electrode surface causes surface wetting resulting in a mercury film.

Yet another method of strengthening of the electrodes with stretchable and electrically conductive coating is lamination using a layer of conductive elastomers such as silicone rubber with a silver particle additive.

FIG. 4 shows three PVdF windings 32 out of a total of sixteen used in a linear array. Cross-hatched area is the cross-section of the PVdF film strip 19. One surface of PVdF film strip 19 is a neutral electrode 27 shown by a heavy solid line. "Hot" electrode 21 on another side of PVdF film strip 19 is shown by a dashed line. The clear narrow area between electrodes, and between electrode and pin, is a stretchable, electrically conductive coating 33.

An S loop of metallized PVdF strip 20 is wound around and supported by pins 30 and 31 so that the electrode center line 29 is located halfway between pins 30 and 31. A winding process consists of rotation of pins 30 and 31 as a unit, counter clockwise around the center line 29 which forms an axis of winding rotation. This winding process produces a bifilar winding where metallized surfaces of like polarity are in contact with each other. The 1.5 mm gap 22 devoid of metallization is located between the windings.

Pin 3 makes contact with the neutral electrode 27 and pin 30 makes contact with the hot electrode 21. The electrical connection and the mechanical support are thus combined in the winding design shown in FIG. 4.

Metallized electrodes 21 and 27 ar covered with a thin stretchable, electrically conductive coating 33 of graphite. The lubricating property of graphite at the surface between the pin and electrode eases the motion due to expansion and contraction of metallized PVdF strip 20 and stationary pins 30 and 31. Electrical conductivity of graphite film between electrodes bridges the contact between the islands of metallization caused by stresses due to curvature, due to induced motion of the PVdF strip, and due to thermal cycling. This interconnection between islands of metallization leads to uniform current flow and even electrical field across the PVdF strip. Graphite coating further adds body to the PVdF strip which makes uniform winding easier.

FIG. 4 is not drawn to scale: The 9 micron thickness of the metallized PVdF strip 20 and a 2 micron thickness of the coating of graphite are exaggerated when compared to the 0.35 mm diameter of the supporting pins in order to show the detail of the winding. Three winding rotations resulting in seven layers of PVdF are shown in FIG. 4. Actually, five turns are used resulting in eleven layers of PVdF.

FIGS. 5A, 5B, 5C and 5D show four views of a bottom assembly of an array module 46 composed of two 1×16 linear actuator arrays. FIG. 5A through 5D show details of a connection of thirty-two pairs of supporting pins 30 and 31 to form an electrical connector 47. A top view along the plane D—D' in FIG. 5A shows that each actuator pin pair 30–31 passes through a ceramic holder block 36. There is a total of thirty two such ceramic holder block 36 in a linear actuator array module 46. FIG. 5 also shows the bonding of bottom of PVdF winding 32 by adhesive film 34 to ceramic holder block 36 which assures mechanically stationary termination of the bottom of PVdF winding 32.

As can be seen in a front view along the plane B—B' and a side view along plane C—C', supporting neutral pin 31 after passage through ceramic holder block 36 is attached using conductive epoxy to a metal ground rail 37. The ends of metal ground rail 37 flare out into ground interconnection pads 38 and 39. Holes 40 in pad 38 and hole 41 in pad 39 are then used to bolt together individual linear actuator array modules 46 into a larger tactile array 60 (shown in FIG. 7) while at the same time providing a firm electrical ground connection for the neutral array electrodes.

As can be seen in the back view along the plane A—A', the outer hot pins 30, which make contact with the hot electrodes, penetrate through a holes in ceramic holder blocks 36 and ceramic connector block 42 and form a thirty-two pin electrical connector 47 shown in the bottom view in FIG. 5C and in side view in FIG. 5D. For insulation purposes, the outer hot pins 30 are covered with thin-walled plastic tubing 43 between the two ceramic blocks 36 and 42.

Details of a top assembly of the linear actuator array module 46 are illustrated in FIGS. 6A and 6B. Movable keys 44 joined to the top of PVdF windings 32 by adhesive film 50 are shown. Two adjacent actuators (of the total of thirty-two actuators in a module) are shown. A top view cross-section through keys 44 and pins 30 and 31 along the plane A—A' (defined in FIG. 6B) is shown in FIG. 6A FIG. 6B shows the side view along the plane B—B' (defined in FIG. 6A) through the same elements. Pins 30 and 31 are joined together above the PVdF winding 32 by epoxy filler 45. The cross-section of Key 44 is a rounded rectangle on the outside and an elongated hole on the inside. This hole clears the supporting pins 30 and 31 and the epoxy filler 45. On its base, key 44 is bonded to the top of the PVdF winding 32 using an adhesive film 50. Thus, key 44 moves up and down with elongation and constriction of the PVdF winding 32, sliding along the bonded pins 30 and 31. A top surface of the actuator keys 44 is covered by a thin, pliable plastic sheet 51 (such as trademarked product SARAN WRAP) to protect it from dirt and dust without interfering with the motion of the individual keys.

FIG. 7 shows a top view of a tactile array 60 with the thin plastic sheet 51 removed. Rectangular columns 46 in FIG. 7 represent array module 46 with thirty-two actuators each. Tactile array 60 comprising eight such array modules 46, has two hundred and fifty-six moving keys 44. The eight modules and the two end plates 56 are bolted together by screws 55 and nuts 52. Wire 54 is connected to the electrical ground through eyelet 53.

Since the PVdF winding 32 is wound and operated on the same two pins 30 and 31, there is no need for a tricky winding transfer operation or for very tight tolerances on pin diameter and spacing. Pins 30 and 31 provide a reliable, large area for electrical contact to the electrodes. In terms of reliability and modest contact current density, this is a very significant improvement over bonding of wires to metallization.

In the preferred embodiment, forces resulting from the application of a transverse electric field to the PVdF winding, working against the mechanical load due to skin pressure against key 44, produce motion of the PVdF winding which is constrained to a single longitudinal degree of freedom along the surfaces of pins 30 and 31. Buckling of the winding 32 under load is thus prevented.

While certain specific embodiments of improved piezopolymer actuators have been disclosed in the foregoing description, it will be understood that various modifications within the scope of the invention may occur to those skilled in the art. Therefore it is intended that adaptations and modifications should and are intended to be comprehended within the meaning and range of equivalents of the disclosed embodiments.

What is claimed is:

1. An actuator comprising
   a base;
   a first and a second pin made from electrically conducting material, said first pin and said second pin fastened parallel to each other at the base;

a means for applying a driving voltage to said pins at the base;

a winding, slidably disposed with respect to the pins, comprising a strip of piezopolymer film, said strip having a distension direction coincident with an axis of the winding and said strip comprising a first electrode on a first face of said piezopolymer strip and a second electrode on a second face of said piezopolymer strip, said winding following a path between and around said first pin and said second pin, for providing a sliding surface contact between said first electrode and said first pin and between said second electrode and said second pin, whereby the driving voltage applied thorough the pins and through a sliding contact between pins and the electrodes, to the electrodes, causes a distension of the piezopolymer winding with respect to and along the pins, said distension constituting a mechanical response of the actuator to the driving voltage; and a means for coupling a mechanical load to the distension of the winding.

2. An actuator in accordance with claim 1 comprising a coating of conductive lubricant between said first pin and said first electrode and said second pin and said second electrode for enhancement of electrical sliding contact between said electrodes and said pins.

3. An actuator in accordance with claim 1 wherein the means for applying said driving voltage to said pins comprise conductive traces on a printed circuit board in registration with and contacting the pins protruding beyond said base.

4. An actuator in accordance with claim 1 comprising a coating of graphite between adjoining electrodes.

5. An actuator in accordance with claim 1 comprising a coating of mercury between adjoining electrodes.

6. An actuator in accordance with claim 1 comprising an elastic bonding layer between adjoining electrodes.

7. An actuator in accordance with claim 1 comprising a stretchable and electrically conductive coating between adjoining electrodes.

8. An array of actuators comprising a base;

a plurality of electrically conducting parallel pins, ordered in pairs, and held and constrained by the base;

a means for applying electrical driving potential to each pair of said pins;

a plurality of windings made from a strip of a piezopolymer film intercalated between a pair of electrodes, said windings slidably supported by a pair of said pins, for constraining the expansion and contraction of said strip of piezopolymer film in the winding to a single, sliding degree of freedom along a surface of said pins, and for providing a sliding electrical contact between each said electrode and corresponding said pin; and means for mechanically loading the expansion and contraction of the piezopolymer film, caused by the electrical driving potential, connected through the pins and through the sliding electrical contact between the pair of pins and the corresponding pair of electrodes, to said electrodes.

9. An array of actuators comprising a base made from an electrically insulating material;

a plurality of parallel pins made from an electrically conducting material, supported and constrained by the base;

an electrical connector means located below the base for applying driving voltages to the pins;

a plurality of windings, located above the base, said windings made from a metallized piezopolymer strip, said metallization forming two electrodes on each face of said strip, said strip slidably wound in a bifilar fashion around two adjacent pins, with a direction of distension of the piezopolymer strip substantially parallel to axes of the pins for allowing a sliding motion of said strip with respect to said supporting pin and resulting in sliding electrical contact between the pins and a corresponding said electrode, whereby driving voltages applied through the electrical connector means to said pins, and from the pins, over a surface contact area, to the electrodes cause a distension of the piezopolymer, said distension confined by the pins to a sliding motion along the surface of the pins, in response to the applied driving voltage; and means for applying mechanical loads to said sliding distension motion of said windings.

10. An array of actuators in accordance with claim 9, wherein said base further comprises a first perforated plate and a second perforated plate, both plates exhibiting a matching pattern of holes, each pin threaded through a corresponding hole in the first plate and in the second plate, said plates separated by a distance of an order of a centimeter, and said separation filled with an encapsulant.

11. An array of actuators in accordance with claim 10, wherein said base further comprises a metal rail housed between said first and said second plates with one pin per winding electrically connected to said metal rail, said metal rail connected to the electrical ground return, and a remaining pin per winding protruding below said base and contacting said connector.

12. An array of actuators in accordance with claim 9 wherein the means for applying mechanical loads comprises keys attached to an end of the windings opposite the base, said keys transmitting the sliding motion of the windings to skin in touch with said keys for producing a tactile sensation in the skin.

13. An actuator in claim 1 wherein said first and said second pins are made from steel plated with transition metal.

* * * * *